(12) United States Patent
Hasegawa (10) Patent No.: US 7,150,810 B2
(45) Date of Patent: Dec. 19, 2006

(54) SPUTTERING TARGET AND METHOD FOR FABRICATING THE SAME

(75) Inventor: Takashi Hasegawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/370,466

(22) Filed: Feb. 24, 2003

(65) Prior Publication Data
US 2003/0188964 A1 Oct. 9, 2003

(30) Foreign Application Priority Data
Apr. 9, 2002 (JP) ............................. 2002-106602

(51) Int. Cl.
*C23C 14/35* (2006.01)
(52) U.S. Cl. ..................... 204/192.17; 204/192.12; 204/192.15; 204/298.12; 204/298.13
(58) Field of Classification Search ........... 204/192.15, 204/298.13, 192.12, 192.17, 298.12
See application file for complete search history.

(56) References Cited

U.S. PATENT DOCUMENTS

| 5,282,943 | A | * | 2/1994 | Lannutti et al. ....... 204/192.12 |
| 5,287,619 | A | * | 2/1994 | Smith et al. .................. 29/852 |
| 5,358,615 | A | * | 10/1994 | Grant et al. ........... 204/192.15 |
| 5,540,823 | A | * | 7/1996 | Fritsche ................. 204/298.19 |
| 6,030,514 | A | * | 2/2000 | Dunlop et al. ......... 204/298.12 |
| 6,562,715 | B1 | * | 5/2003 | Chen et al. ................. 438/643 |

FOREIGN PATENT DOCUMENTS

JP        5-98423        4/1993

\* cited by examiner

*Primary Examiner*—Rodney G. McDonald
(74) *Attorney, Agent, or Firm*—Staas & Halsey LLP

(57) ABSTRACT

A sputtering target includes a backing plate, a copper target provided on the backing plate, and a protection layer formed of a corrosion-resistant metal on the surface of the copper target The protection layer depresses oxidation of the copper target and the adhesion of particles to a substrate due to the release of a deposited layer on the surface of the shielding plate.

20 Claims, 6 Drawing Sheets

SPUTTERING TARGET AND METHOD FOR FABRICATING THE SAME

CROSS-REFERENCE TO RELATED APPLICATIONS

This application is based upon and claims priority of Japanese Patent Application No. 2002-106602, filed on Apr. 9, 2002, the contents being incorporated herein by reference.

BACKGROUND OF THE INVENTION

The present invention relates to a sputtering target of a metal, such as copper or others, which can be easily oxidized, and a method for fabricating the sputtering target.

As interconnection layers of the current highly integrated semiconductor devices, copper interconnection layers have taken the place of aluminum interconnection layers.

Generally, electroplating is widely used for forming copper interconnection layers. In forming copper interconnection layers by electroplating, a base conductor layer of a metal, such as copper or others, must be formed in advance. To form such base conductor layer, generally sputtering is used.

Figure 5A:
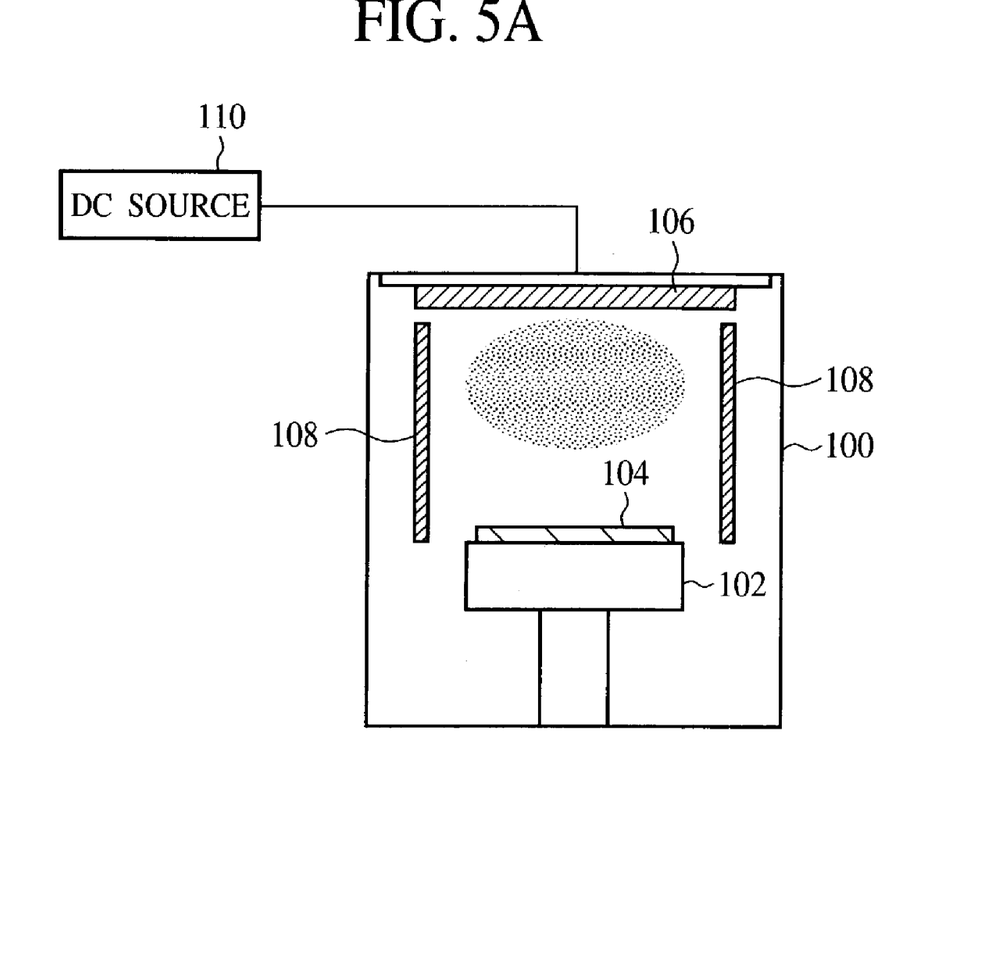
FIGS. 5A and 5B are diagrammatic views of the sputtering system and the surface of the conventional sputtering target.

FIG. 5A is a diagrammatic view of a magnetron sputtering system generally used in forming the above-described base conductor layer of copper or others. As shown, a substrate 104 of silicon or others to be sputtering processed is held substantially horizontal on a stage 102 disposed in a chamber 100. A heater (not shown) for heating the substrate 104 as required is provided in the stage 102. A sputtering target 106 is mounted on the inside of the chamber 100 above the substrate 104, opposed to the surface of the substrate 104. A shielding plate 108 is disposed surrounding the space between the substrate 104 and the sputtering target 106. A direct current source 110 interconnects the sputtering target 106 as a cathode and the substrate 104, so that a high negative voltage can be applied to the sputtering target.

In the sputtering processing, an internal pressure of the chamber 100 is decreased to a prescribed pressure, and a sputtering gas, such as argon gas, is fed into the chamber 100. Then, a voltage is applied by the direct current source 110. Thus, argon plasmas are generated between the sputtering target 106 and the substrate 104. The thus dissociated argon ions impinge on the sputtering target 106, which is the cathode to sputter the metal atoms. The sputtered metal atoms arrive at the substrate 104 to thereby form a metal layer on the substrate 104.

Figure 5B:
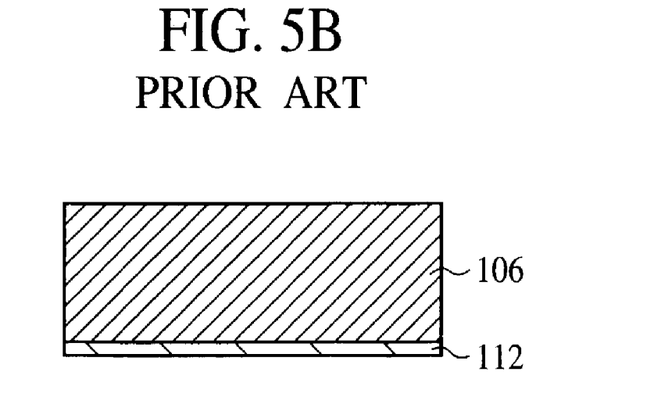

To form the base conductor layer of copper by sputtering, a sputtering target of copper is necessary. In comparison with the sputtering target of aluminum, the surface of the copper sputtering target is very easily oxidized. That is, as shown in FIG. 5B, usually an oxide layer 112 of copper oxide is formed on the surface of the copper sputtering target 106.

When copper is applied to a substrate of silicon or others by the magnetron sputtering system by using a copper sputtering target with an oxide layer thus formed on the surface, it is necessary to prevent the oxide on the surface of the target from adhering to the substrate. To this end, conventionally, a prescribed amount of sputtering processing is performed on a dummy substrate to thereby sufficiently remove the oxide layer on the target surface, and sputtering processing is performed on a substrate to apply copper thereto. The processing for removing the oxide layer formed on the sputtering target surface before said sputtering processing is called burn-in processing or pre-sputtering processing.

Figure 6A:
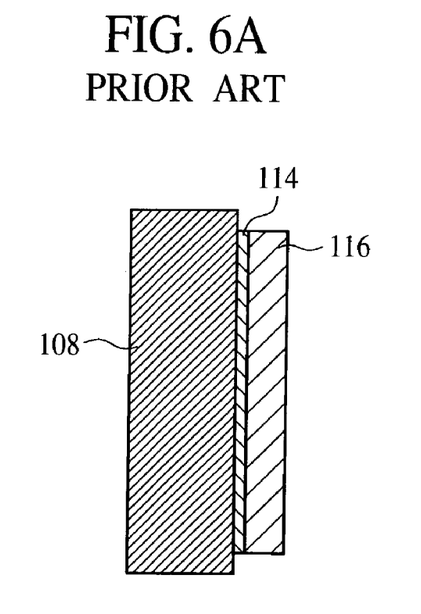
FIGS. 6A and 6B are diagrammatic views of states of the shielding plate of the sputtering system using the conventional sputtering target after the burn-in processing and the sputtering processing.
Figure 6B:
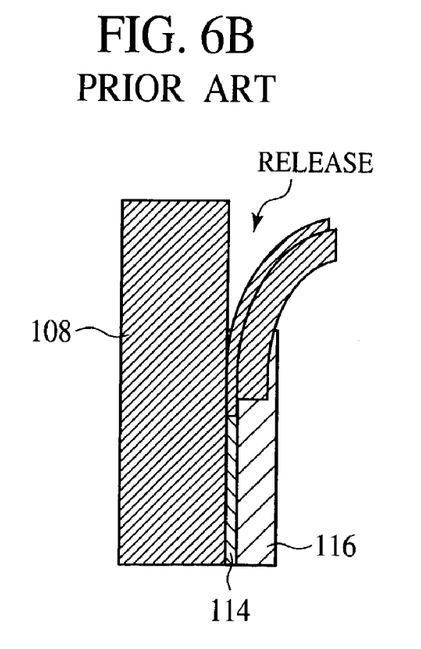

In using the conventional copper sputtering target with an oxide layer formed on the surface, a disadvantage is that particles tend to adhere to a substrate to be sputtering processed. The adhesion of particles to a substrate in using the copper sputtering target will be explained with reference to FIGS. 6A and 6B. FIGS. 6A and 6B are diagrammatic views of states of the shielding plate of the sputtering system after the burn-in processing and the sputtering processing.

In the burn-in processing, the oxide from an oxide layer on the surface of the copper sputtering target adheres to the surface of the shielding plate in the chamber to form a contaminant layer of the copper oxide. Then, in the intended sputtering process, the copper adheres to the contaminant layer formed on the surface of the shielding plate. FIG. 6A is a diagrammatic view of the contaminant layer 114 formed on the surface of the shielding plate 108 and the copper layer 116 formed on the contaminant layer 114.

Generally, in the sputtering processing, depositing particles impinge at high energies on an object for the particles to adhere to, and it can be said that the formed deposited layer does not easily peel off. However, in the above-described burn-in processing, the contaminant layer 114 formed on the surface of the shielding plate 108 is formed of the oxide called copper oxide, which is exhibits poor adhesion to the surface of the shielding plate 108 of stainless steel or others. Then, as shown in FIG. 6B, the contaminant layer 114 easily peels off the surface of the shielding plate 108 due to stresses of a copper layer 116 formed on the contaminant layer 114 or thermal stresses caused by the sputtering process. The deposits, which have grown on the surface of the shielding plate 108, peel off, with the result that the particles adhere to a substrate in the sputtering processing.

The influence of the above-described particle adhesion to substrates on semiconductor devices is becoming an unignorable and critical problem as the high integration goes on.

As a method for preventing the surface of the sputtering target from being oxidized, an adhesive tape or the like is adhered to the surface until a time immediately before the sputtering target is mounted on the sputtering system. This method is effective in shielding the sputtering target surface from the atmospheric air to prevent the oxidation. However, the deposited layer formed by using the sputtering target with an adhesive tape or the like applied thereto is contaminated with organic substances. Because of the sputtering target surface contaminated with an organic substance, a contaminant layer is formed between the shielding plate and the deposited layer, and resultantly the deposited layer on the shielding plate surface tends to easily peel off. As a result, in the sputtering processing, particles tend to adhere to a substrate due to the release of the deposits on the shielding plate surface.

SUMMARY OF THE INVENTION

An object of the present invention is to provide a sputtering target which can depress adhesion of particles to a substrate when the sputtering target is formed of copper which is easily oxidized, and a method for fabricating the sputtering target.

According to one aspect of the present invention, there is provided a sputtering target comprising: a target base of copper; and a protection layer formed on the surface of the target base and formed of corrosion-resistant metal.

According to another aspect of the present invention, there is provided a method for fabricating a sputtering target comprising the step of: forming a protection layer of a corrosion-resistant metal on the surface of a target base of copper.

According to another aspect of the present invention, there is provided a sputtering method for depositing copper on a substrate by using a sputtering target comprising a target base of copper, and a protection layer formed on the surface of the target base and formed of a corrosion-resistant metal, comprising the steps of: pre-sputtering the sputtering target to remove the protection layer; and sputtering the target base to deposit copper on the substrate.

According to another aspect of the present invention, there is provided a method for storing a sputtering target comprising a target base of copper, and a protection layer formed on the surface of the target base and formed of a corrosion-resistant metal in a vacuum package.

According to a further aspect of the present invention, there is provided a method for transporting a sputtering target comprising a target base of copper, and a protection layer formed on the surface of the target base and formed of a corrosion-resistant metal in a vacuum package.

As described above, the sputtering target according to the present invention comprises a target base of copper and a protection layer of a corrosion-resistant metal, whereby the oxidation of the surface of the target base of copper, which is easily oxidized, can be suppressed. Thus, the formation of a contaminant layer on the shielding plate of the sputtering system can be suppressed, and accordingly the adhesion of particles to a substrate due to the release of a deposited layer on the surface of the shielding plate can be suppressed.

DETAILED DESCRIPTION OF THE INVENTION

Figure 1A:
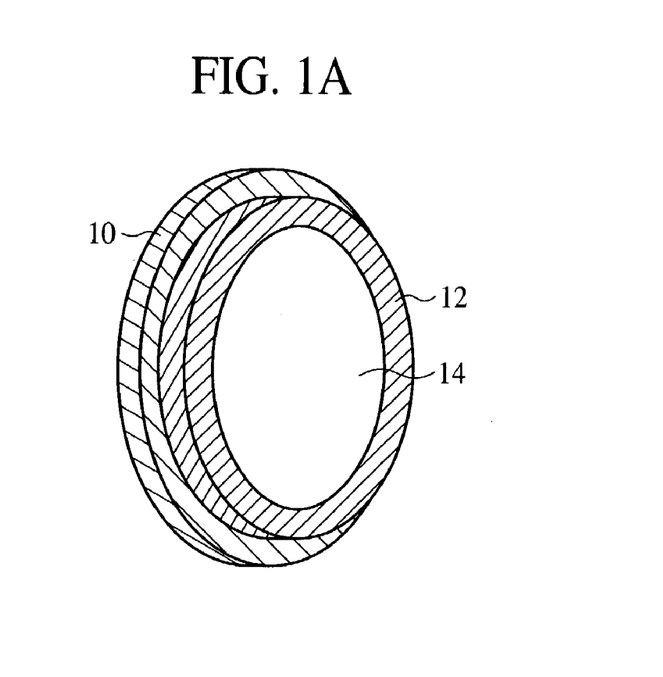
FIGS. 1A and 1B are diagrammatic views of the sputtering target according to one embodiment of the present invention.
Figure 1B:
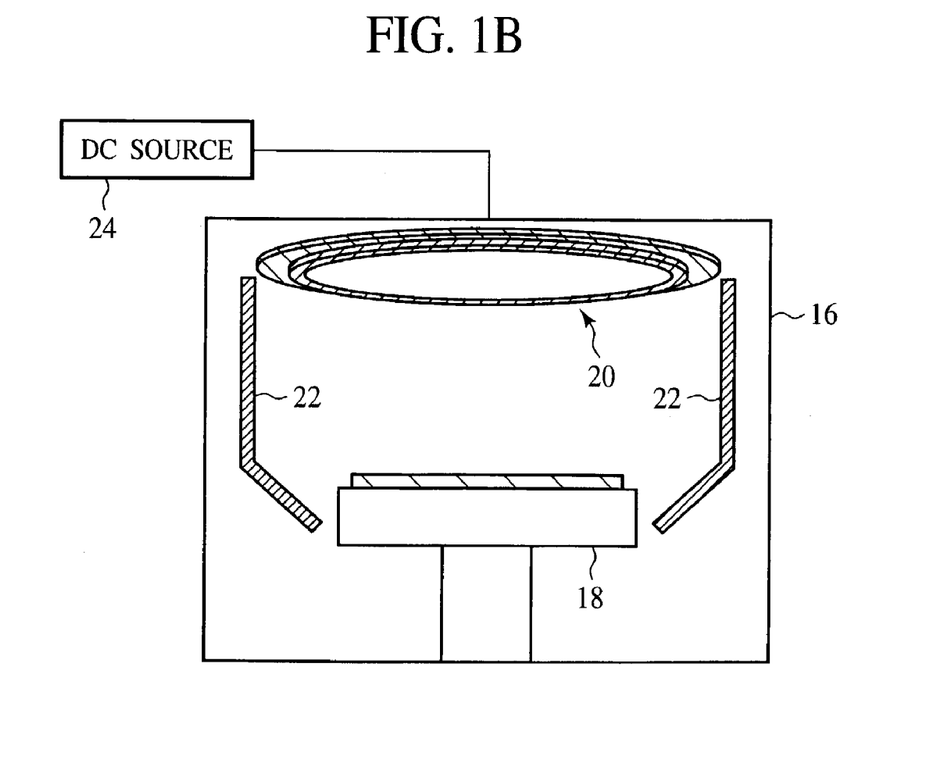

The sputtering target according to one embodiment of the present invention and a method for fabricating the sputtering target will be explained with reference to FIGS. 1A, 1B, 2A, 2B, 2C, 3A, 3B, 3C, 4A, 4B, 4C, and 4D. FIGS. 1A and 1B are diagrammatic views of the sputtering target according to the present embodiment. FIGS. 2A, 2B, 2C, 3A, 3B, and 3C are views of the sputtering target according to the present embodiment in the steps of the method for fabricating the same, the method for storing and transporting the same and the sputtering method, which explain the methods. FIGS. 4A, 4B, 4C, and 4D are sectional views of a semiconductor device in the steps of the method for forming a copper interconnection layer by using the sputtering method according to the present embodiment, which explains the method.

First, the sputtering target according to the present embodiment will be explained with reference to FIG. 1.

As shown in FIG. 1A, on a disc-shaped backing plate 10 to be connected to the cathode of a sputtering system, a disc-shaped copper target 12 of a smaller diameter than the backing plate 10 is disposed. A protection layer 14 of aluminum is formed on the surface of the copper target 12.

FIG. 1B is a diagrammatic view of the sputtering target mounted on the sputtering system, which shows the mounted state.

The sputtering target 20 according to the present embodiment is mounted above a stage 18 which is disposed in a chamber 16 and supports a substrate. A shielding plate 22 is disposed surrounding the space between the stage 18 and the sputtering target 20. The sputtering target 20 is connected to a direct current source 24.

As described above, the sputtering target 20 according to the present embodiment is characterized mainly in that the protection layer 14 of aluminum is formed on the surface-to-be-sputtered of the target 12 of copper, which is easily oxidized. Aluminum which is a material of the protection layer 14 has an oxidized coating of good corrosion resistance, which is called a passive coating formed on the surface, and has a property that oxidation does not advance inside. Accordingly, the protection film 14 of aluminum is formed on the surface of the target 12 of copper, which is easily oxidized, whereby the oxidation of the surface of the copper target 12 can be depressed. As a result, the formation of a contaminant layer of the oxide on the shield plate of the sputtering system can be depressed, and accordingly deposits on the surface of the shielding plate peeling off to adhere to a substrate to be sputtering processed are minimized.

A thickness of the protection layer 14 on the surface of the copper target 12 can be, e.g., 50 μm but is not limited to 50 μm. However, in case of a thickness of the protection layer 14 being below 0.05 μm, oxygen in the atmosphere passes through the protection layer and arrives at the surface of the copper target 12, and the surface of the copper target 12 is oxidized. On the other hand, when a thickness of the protection layer 14 is above 1000 μm, it is difficult to sufficiently remove the protection layer 14 by the burn-in processing. Thus, a thickness of the protection layer 14 is preferably in 0.05–1000 μm, more preferably 50–300 μm.

When the copper target 12 is sputtered by the magnetron sputtering system, plasmas contact the shielding plate 22, and electrons go away to the earth, which makes the generation of plasmas unstable. Accordingly, in the magnetron sputtering, an outer circumferential vicinity of the copper target 12 is little abraded by the plasmas. Accordingly, in a case that the protection layer 14 is formed up to the outer circumferential vicinity of the copper target 12, the protection layer 14 formed in the outer circumferential vicinity cannot be easily removed.

Then, the protection layer 14 is not formed in the outer circumferential vicinity of the surface of the disc-shaped copper target 12. Specifically, for the copper target 12 of a 340 mm-diameter, the protection layer 14 may not be formed in the 15 mm-width region from the outer circumference.

Even when the surface of the outer circumferential vicinity of the copper target 12 with the protection layer 14 not formed in is oxidized, a ratio of an area of the outer circumferential vicinity is small to a entire surface of the copper target 12. Specifically, in the case that the protection layer 14 is not formed in a 15 mm-width region from the outer circumferential vicinity of the copper target of a 340 mm-diameter, an area with the protection layer 14 not formed in is 17% to the entire area. Accordingly, the generation amount of oxides of copper from the copper target 12 is little. Thus, even when copper oxides from the outer circumferential region adhere to the shielding plate 22, the adhesion amount is little, and the deposited copper does not peel off from the shielding plate 22.

Next, the method for fabricating the sputtering target according to the present embodiment, the method for storing and transporting the same, and a string of the steps of the method for sputtering processing using the sputtering target according to the present embodiment will be explained with reference to FIGS. 2A, 2B, 2C, 3A, 3B, and 3C.

First, the method for fabricating the sputtering target will be explained.

Figure 2A:
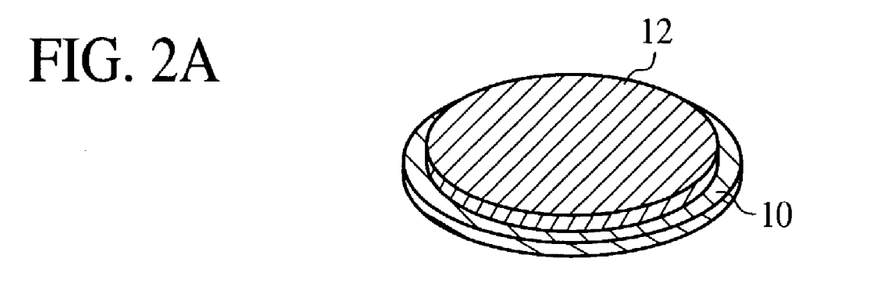
FIGS. 2A, 2B and 2C are views of the sputtering target in the steps of the method for fabricating the sputtering target and the method for storing and transporting the sputtering target, which explain the methods.

Copper plates are machined by a precision lathe to form the backing plate 10 and a copper target 12 (FIG. 2A). For example, the copper target 12 is formed of a copper plate of a high purity (6N) for semiconductor devices, and the backing plate 10 is formed of a copper plate of the usual grade. The copper target 12 and the backing plate 10 are combined with each other by bonding.

Figure 2B:
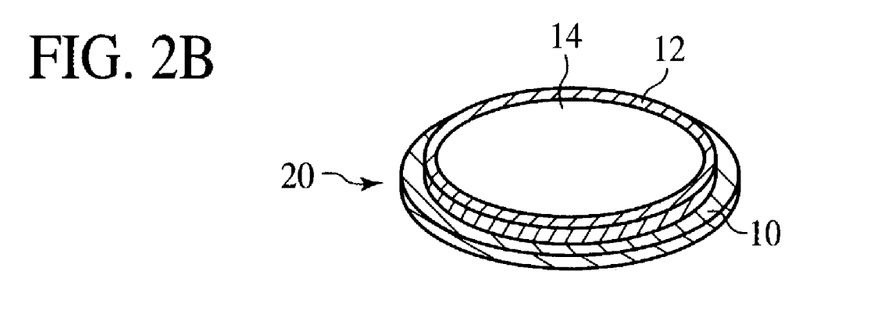

Then, the protection layer 14 of aluminum is formed on the surface of the copper target 12 within 12 hours after the machining by the precision lathe is finished, so that the surface of the formed copper target 12 is not oxidized (FIG. 2B). As a method for forming the protection film 14, the flame spraying, for example, in which an aluminum wire is continuously fed while being melted with gas flames, and pulverized globules of aluminum are blasted with compressed air, can be used.

Thus, the sputtering target 20 according to the present embodiment is formed.

Figure 2C:
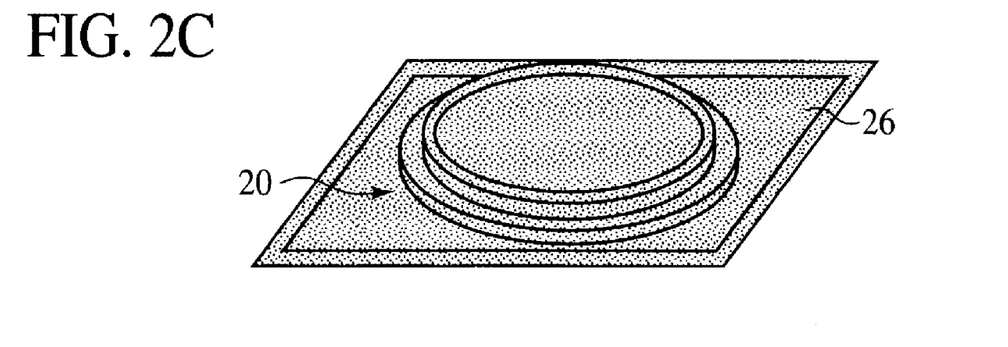

Next, the sputtering target 20 is sealed in a vacuum pack 26 having the air replaced by an inert gas, such as nitrogen gas or others to be vacuum-packaged so that the side surfaces of the backing plate 10 and the copper target 12 are not oxidized (FIG. 2C).

Thus, being vacuum-sealed, the sputtering target 20 is stored or transported to a site or others.

When the conventional copper target, whose surface is exposed to the atmosphere, is exposed to the atmosphere for more than 24 hours, i.e., a period of time from the lathe machining of the target to the package of the target with the use of an inert gas and a period of time from unpackaging the target to mounting of the target on a sputtering system, the surface of the copper is oxidized and discolored.

In contrast to the conventional sputtering target, the sputtering target 20 according to the present embodiment is vacuum-packaged in the vacuum pack 26, and furthermore, the protection layer 14 is formed on the surface of the copper target 12, whereby the surface of the copper target 12, which is easily oxidized, is not exposed to the atmosphere. Thus, the sputtering target 20 can be stored or transported with the surface of the copper target 12 kept from being oxidized. As described above, the sputtering target 20 according to the present embodiment can keep the surface of the copper target 12 from being oxidized, which facilitates handling the sputtering target 20 in comparison with the conventional sputtering target.

Then, the sputtering method using the sputtering target 20 according to the present embodiment, which is fabricated as described above and stored and transported in the vacuum package as shown in FIG. 2C will be explained.

Figure 3A:
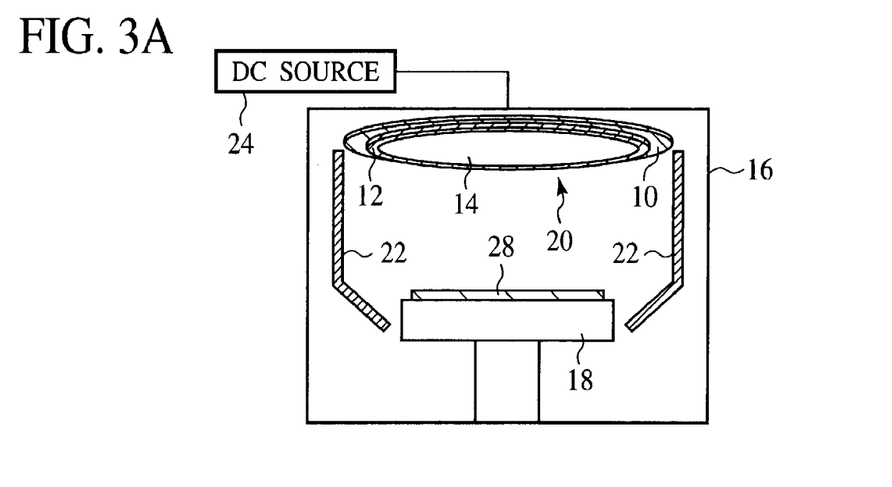
FIGS. 3A, 3B and 3C are views of the sputtering target according to the embodiment in the steps of the method for sputtering processing the sputtering target, which explain the method.

First, the vacuum package 26 is opened to take out the sputtering target 20. Then, the sputtering target 20 is mounted in the chamber 16 of the sputtering system (FIG. 3A).

Figure 3B:
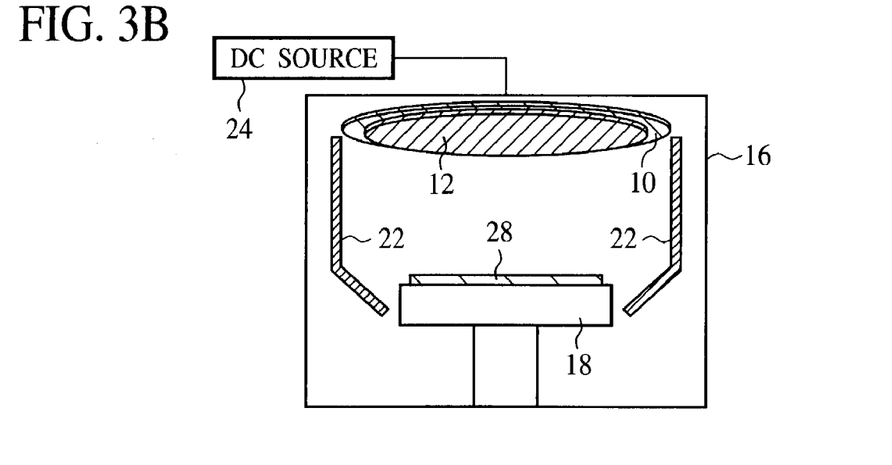

Next, a dummy substrate 28 is held on the stage 18. The interior of the chamber 16 is depressurized to a prescribed pressure, and argon, for example, as a sputtering gas is supplied into the chamber 16. Then, a voltage is applied from the direct current source 24 to excite argon plasmas to sputter the protection layer 14 of aluminum formed on the surface of the copper target 12 by argon ions. Thus, the burn-in processing is performed to remove the protection layer 14 of aluminum formed on the surface of the copper target 12 (FIG. 3B).

In this burn-in processing, the aluminum of the protection layer 14 adheres to the shielding plate 22. Aluminum has good adhesion to the shielding plate 22 and copper. Accordingly, when copper adheres to the aluminum layer staying on the surface of the shielding plate 22 in the following copper sputtering, the copper does not easily peel off. Resultantly, in the copper sputtering processing after burn-in processing, adhesion of particles to a substrate can be suppressed.

Figure 3C:
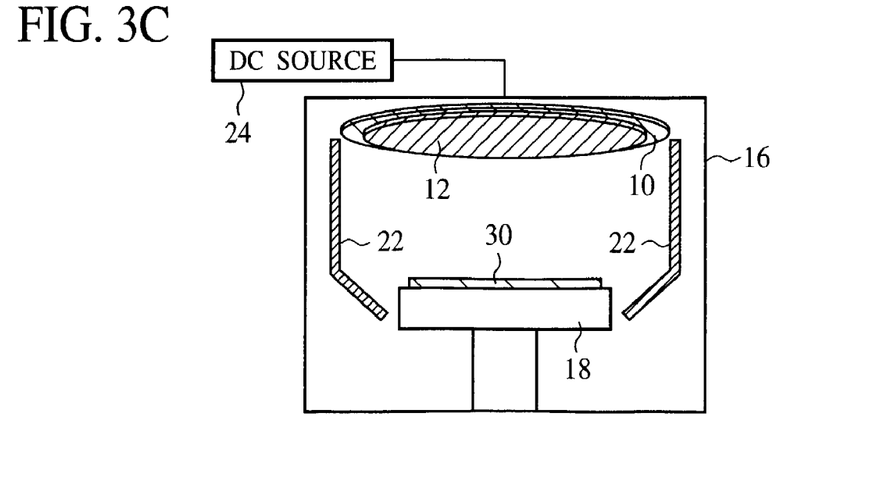

After the protection layer 14 is sufficiently removed by the burn-in processing, the dummy substrate 28 is unloaded, and a substrate 30 to be copper sputtering processed is held on the stage 18. Then, the interior of the chamber 16 is depressurized to a prescribed pressure, and argon, for example, as a sputtering gas is supplied into the chamber 16. Then, a voltage is applied from the direct current source 24 to excite argon plasmas, and the surface of the copper target 12 is sputtered by argon ions. The thus-sputtered copper atoms of the copper target 12 arrive at the substrate 30, and a copper layer is formed on the substrate 30 (FIG. 3C).

The above-described sputtering method according to the present embodiment is applicable, e.g., to forming a seed layer for forming copper interconnection layers of semiconductor devices by electroplating. The method for forming a copper interconnection layer of a semiconductor device, to which the sputtering method according to the present embodiment is applied, will be explained with reference to FIGS. 4A, 4B, 4C, and 4D.

Figure 4A:
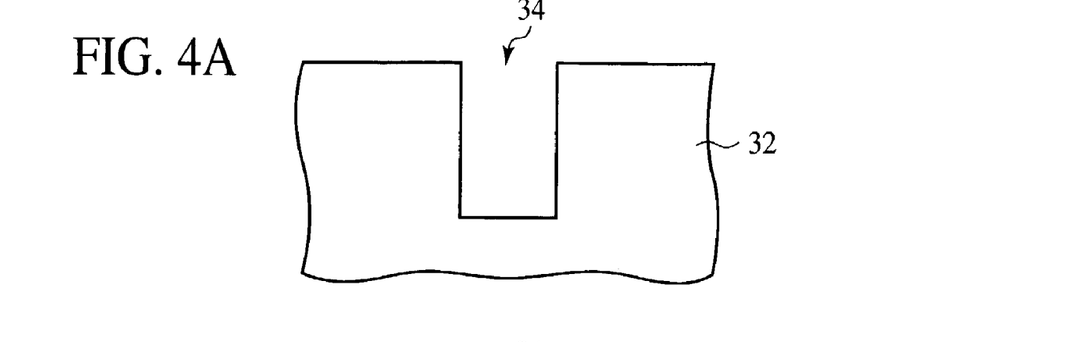
FIGS. 4A, 4B, 4C, and 4D are sectional views of a semiconductor device in the steps of the method for forming a copper interconnection layer of the semiconductor device, to which the sputtering method according to the embodiment of the present invention.

First, grooves 34 of a prescribed depth and width are formed in an oxide film 32 formed on a substrate of silicon or others (not shown) in a prescribed interconnection layer pattern by the usual lithography and etching (FIG. 4A).

Figure 4B:
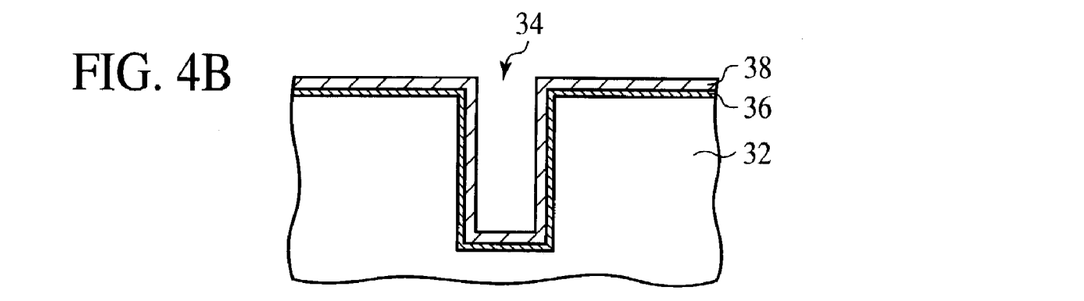

Then, a tantalum nitride layer 36 of, e.g., a 25 nm-thickness is formed as a barrier metal on the entire surface of the insulation film 34 with the grooves 34 formed by the usual sputtering method. Then, the copper layer 38 of, e.g., a 150 nm-thickness which functions as a seed layer for electroplating is formed on the entire surface by the sputtering method according to the present embodiment (FIG. 4B).

At this time, with the oxidation of the surface of the copper target used for the sputtering processing suppressed, the formation of a contaminant layer of the oxides on the shielding plate of the sputtering system, whereby the adhesion of particles to the substrate can be suppressed.

Figure 4C:
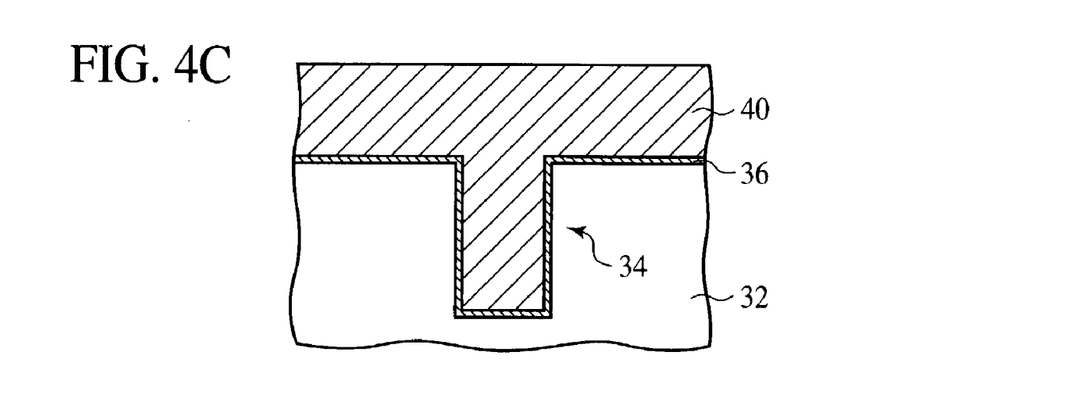

Then, with the copper layer 38 formed by the sputtering method according to the present embodiment as a seed layer, the copper layer 40 of, e.g., a 1 µm-thickness is formed on the entire surface by electroplating. Thus, the grooves 34 of the interconnection layer pattern are filled with the copper layer 40 (FIG. 4C).

Figure 4D:
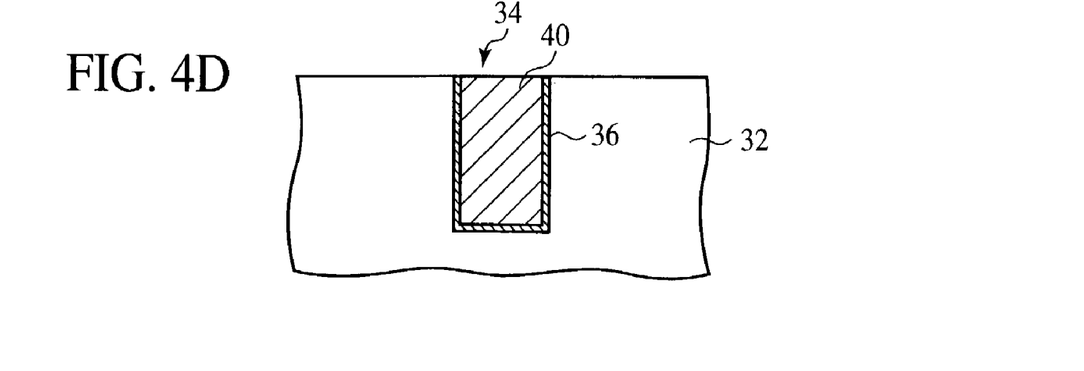

Next, the entire surface is polished by CMP (Chemical Mechanical Polishing) to remove the excessive copper layer 40 except that in the grooves 34 (FIG. 4D).

Thus, the copper interconnection layer of the copper layer 40 buried in the grooves 34 in the insulation film 32 is formed.

As described above, according to the present embodiment, the protection layer 14 of aluminum is formed on the surface of the copper target 12, which is easily oxidized, whereby the surface of the copper target 12 is not exposed to the atmosphere, and the oxidation of the surface of the copper target 12 can be suppressed. Thus, the adhesion of oxides to the shielding plate 22 of the sputtering system can be suppressed. Resultantly, the adhesion of particles to a substrate, which is caused by deposits on the surface of the shielding plate 22 peeling off, can be suppressed.

[Modifications]

The present invention is not limited to the above-described embodiment and can cover other various modifications.

For example, in the above-described embodiment, the protection layer 14 is formed of aluminum, but the material of the protection layer 14 is not limited to aluminum. A material of the protection layer 14 can be, other than aluminum, a metal such as tin zinc, nickel, magnesium, titanium or others. These metals have merits that they are not easily oxidized in the atmosphere, and that when they are used in forming copper interconnection layers of semiconductor devices, they provide longer usefulness of the copper interconnection layers.

A metal, such as, e.g., zirconium, vanadium, molybdenum, cobalt or others, which has good adhesion to both copper and the shielding plate 22 and does not easily form oxide films, can be used as a material of the protection layer 14. A metal which is good adhesion not only to the shielding plate 22 but also other members incorporated in the chamber 16 of the sputtering system is used as a material of the protection layer 14, whereby the adhesion of particles to substrates can be further suppressed.

In the above-described embodiment, the protection layer 14 of aluminum is formed on the surface of the copper target 12 by flame spraying, but the method for forming the protection layer 14 is not limited to the flame spraying. For example, the protection layer 14 may be formed by sputtering, vapor deposition, chemical growth or others.

In the above-described embodiment, the protection layer 14 is not formed in an outer circumferential vicinity of the copper target 12. However, the protection layer 14 may be formed in the outer circumferential vicinity, and in this case, it is preferable that the protection layer 14 formed in the outer circumferential vicinity is thin enough to be removed by the burn-in processing and is formed in a smaller thickness than the protection layer 14 formed in a central vicinity. The protection film 14 of, e.g., a 2 µm-thickness aluminum is formed also in the outer circumferential vicinity, whereby the sputtering target can be stored in the atmosphere for several months without the surface of the copper target being oxidized.

In the above-described embodiment, the sputtering system using the sputtering target according to the present invention is explained by means of the magnetron sputtering system, but the sputtering system is not limited to the magnetron sputtering system.

In the above-described embodiment, the sputtering method according to the present invention is used in forming the seed layer for the step of forming the copper interconnection layer. However, the application of the sputtering method according to the present invention is not limited to said step and is applicable various steps.

What is claimed is:

1. A sputtering target comprising:
   a target base of copper; and
   a protection layer formed on a surface-to-be-sputtered of the target base from a metal which is more oxidation resistant than copper and which is more adherable than copper oxide to shielding mounted in a chamber of a sputtering system between the target and a substrate, to inhibit copper oxide from forming at the target and adhering to the shielding, the protection layer not being formed in an outer circumferential vicinity of the surface-to-be-sputtered of the target base, or being formed thinner in the outer circumferential vicinity of the surface-to-be-sputtered of the target base than a remainder thereof.

2. A sputtering target according to claim 1, wherein the protection layer is formed of aluminum, zinc, tin, nickel, magnesium, titanium, zirconium, vanadium, molybdenum or cobalt.

3. A sputtering target according to claim 1, further comprising vacuum packaging receiving the target base therein.

4. A sputtering target according to claim 1, wherein the protection layer has a thickness in the range of 0.05 µm to 1000 µm.

5. A sputtering method for depositing copper on a substrate by using a sputtering target, comprising the steps of:
   forming a target base of copper, and a protection layer on a surface-to-be-sputtered of the target base from metal which is more oxidation resistant than copper and which is more adherable than copper oxide to shielding mounted in a chamber of a sputtering system between the target and the substrate, to inhibit copper oxide from forming at the target and adhering to the shielding, the protection layer not being formed in an outer circumferential vicinity of the surface-to-be-sputtered of the target base, or being formed thinner in the outer circumferential vicinity of the surface-to-be-sputtered of the target base than a remainder thereof;
   pre-sputtering the sputtering target to remove the protection layer; and
   sputtering the target base to deposit copper on the substrate.

6. A sputtering method according to claim 5, wherein the substrate comprises a semiconductor substrate, and an insulation film is formed on the semiconductor substrate with interconnection layer grooves formed therein.

7. A sputtering target according to claim 5, wherein the protection layer is selected to have a thickness in the range of 0.05 µm to 1000 µm.

8. A sputtering target comprising:
   a target base of copper; and
   an aluminum protection layer formed on a surface-to-be-sputtered of the target base, the protection layer not being formed in an outer circumferential vicinity of the surface-to-be-sputtered of the target base, or being formed thinner in the outer circumferential vicinity of the surface-to-be-sputtered of the target base than a remainder thereof.

9. A sputtering target according to claim 8, further comprising vacuum packaging receiving the target base therein.

10. A sputtering target according to claim 8, wherein the protection layer has a thickness in the range of 0.05 μm to 1000 μm.

11. A sputtering method for depositing copper on a substrate by using a sputtering target, comprising the steps of:
forming a target base of copper, and an aluminum protection layer on a surface-to-be-sputtered of the target base, the protection layer not being formed in an outer circumferential vicinity of the surface-to-be-sputtered of the target base, or being formed thinner in the outer circumferential vicinity of the surface-to-be-sputtered of the target base than a remainder thereof;
pre-sputtering the sputtering target to remove the protection layer; and sputtering the target base to deposit copper on the substrate.

12. A sputtering method according to claim 11, wherein the substrate comprises a semiconductor substrate, and an insulation film is formed on the semiconductor substrate with interconnection layer grooves formed therein.

13. A sputtering target according to claim 11, wherein the protection layer is selected to have a thickness in the range of 0.05 μm to 1000 μm.

14. A sputtering target comprising:
a target base of copper; and
a protection layer formed on a surface-to-be-sputtered of the target base from a metal which is more oxidation resistant than copper, the protection layer not being formed in an outer circumferential vicinity of the surface-to-be-sputtered of the target base, or being formed thinner in the outer circumferential vicinity of the surface-to-be-sputtered of the target base than a remainder thereof.

15. A sputtering target according to claim 14, wherein the protection layer is formed of aluminum, zinc, tin, nickel, magnesium, titanium, zirconium, vanadium, molybdenum or cobalt.

16. A sputtering target according to claim 14, further comprising vacuum packaging receiving the target base therein.

17. A sputtering target according to claim 14, wherein the protection layer has a thickness in the range of 0.05 μm to 1000 μm.

18. A sputtering method for depositing copper on a substrate by using a sputtering target, comprising the steps of:
forming a target base of copper, and a protection layer on a surface-to-be-sputtered of the target base from metal which is more oxidation resistant than copper, the protection layer not being formed in an outer circumferential vicinity of the surface-to-be-sputtered of the target base, or being formed thinner in the outer circumferential vicinity of the surface-to-be-sputtered of the target base than a remainder thereof;
pre-sputtering the sputtering target to remove the protection layer; and
sputtering the target base to deposit copper on the substrate.

19. A sputtering method according to claim 18, wherein the substrate comprises a semiconductor substrate, and an insulation film is formed on the semiconductor substrate with interconnection layer grooves formed therein.

20. A sputtering target according to claim 18, wherein the protection layer is selected to have a thickness in the range of 0.05 μm to 1000 μm.

* * * * *